(12) United States Patent  
Ravi et al.

(10) Patent No.: US 9,466,595 B2  
(45) Date of Patent: Oct. 11, 2016

(54) FABRICATION OF STACKED DIE AND STRUCTURES FORMED THEREBY

(75) Inventors: Kramadhati V. Ravi, Atherton, CA (US); Jim Maveety, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/958,511

(22) Filed: Oct. 4, 2004

(65) Prior Publication Data

US 2006/0073636 A1  Apr. 6, 2006

(51) Int. Cl.
*H01L 25/00* (2006.01)
*H01L 23/00* (2006.01)
*H01L 25/065* (2006.01)

(52) U.S. Cl.
CPC ............... *H01L 25/50* (2013.01); *H01L 24/26* (2013.01); *H01L 24/83* (2013.01); *H01L 25/0657* (2013.01); *H01L 2224/8385* (2013.01); *H01L 2924/014* (2013.01); *H01L 2924/01006* (2013.01); *H01L 2924/01033* (2013.01); *H01L 2924/07802* (2013.01); *H01L 2924/14* (2013.01); *H01L 2924/19043* (2013.01)

(58) Field of Classification Search
CPC .... H01L 24/26; H01L 24/83; H01L 25/0657
USPC .................. 257/693, 696, 666, 777
See application file for complete search history.

(56) References Cited

U.S. PATENT DOCUMENTS

| | | | |
|---|---|---|---|
| 5,812,435 A * | 9/1998 | Fujinaga ............. | G06F 17/5018 700/117 |
| 5,933,712 A * | 8/1999 | Bernhardt .......... | H01L 23/5387 257/E23.177 |
| 6,256,199 B1 * | 7/2001 | Yusuf ..................... | H01L 23/40 165/185 |
| 6,348,714 B1 * | 2/2002 | Lin ................... | H01L 29/78612 257/347 |
| 6,426,559 B1 * | 7/2002 | Bryan et al. .................. | 257/777 |
| 6,542,393 B1 * | 4/2003 | Chu et al. ....................... | 365/51 |
| 6,627,531 B2 * | 9/2003 | Enquist ............ | H01L 21/76898 257/777 |
| 6,936,131 B2 * | 8/2005 | McCormick et al. ........ | 156/292 |

* cited by examiner

*Primary Examiner* — Amar Movva
(74) *Attorney, Agent, or Firm* — Blakely, Sokoloff, Taylor & Zafman LLP

(57) ABSTRACT

Methods of forming a microelectronic structure are described. Those methods comprise forming a bond between a non-device side of a first die and a non-device side of a second die, wherein forming the bond between the non-device side of the first die and the non-device side of the second die does not comprise using an interfacial glue.

14 Claims, 5 Drawing Sheets

FABRICATION OF STACKED DIE AND STRUCTURES FORMED THEREBY

FIELD OF THE INVENTION

The present invention generally relates to the field of microelectronic devices, and more particularly to methods of fabricating stacked die structures without the use of an interfacial glue.

BACKGROUND OF THE INVENTION

Integrated circuits form the basis for many electronic systems. An integrated circuit may include a vast number of transistors and other circuit elements that may be formed on a single semiconductor wafer or chip and may be interconnected to implement a desired function.

Many modern electronic systems are created through the use of a variety of different integrated circuits; each integrated circuit performing one or more specific function. For example, computer systems may include at least one microprocessor and a number of memory chips. Conventionally, each of these integrated circuits are formed on a separate chip, packaged independently and interconnected on, for example, a printed circuit board (PCB).

As integrated circuit technology progresses, there is a growing desire for a "system on a chip", in which the functionality of all of the integrated circuit devices of the system are packaged together without a conventional PCB. In practice, various "system modules" have been introduced that electrically connect and package integrated circuit devices which are fabricated on the same or on different semiconductor wafers. Initially, system modules have been created by simply stacking two chips, e.g., a logic and memory chip, one on top of the other in an arrangement commonly referred to as chip-on-chip structure. Subsequently, multi-chip module (MCM) technology has been utilized to stack a number of chips on a common substrate to reduce the overall size and weight of the package, which directly translates into reduced system size.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
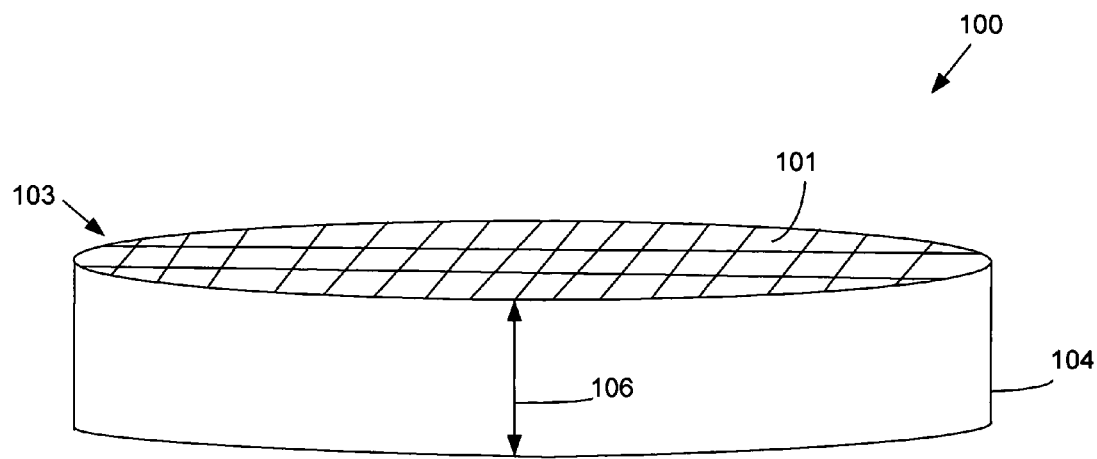
FIGS. 1a-1e represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic device are described. Those methods comprise forming a bond between a non-device side of a first die and a non-device side of a second die, without the use of an interfacial glue. In this manner, improved thermal and electrical contact, as well as a decrease in stress between the bonded die, can be achieved.

FIGS. 1a-1e illustrate an embodiment of a method of forming stacked die structures. FIG. 1a illustrates a device wafer 100. The device wafer 100 may be comprised of materials such as, but not limited to, silicon, silicon-on-insulator, silicon on diamond, or combinations thereof. The device wafer 100 may comprise a device portion 103, and a non-device portion 104. The non-device portion 104 of the device wafer 100 may comprise a first thickness 106. The device wafer 100 may comprise a plurality of die 101, as are known in the art. The plurality of die 101 may comprise various functionalities, such as, but not limited to, a memory functionality and/or a logic functionality, as are well known in the art.

Figure 1B:
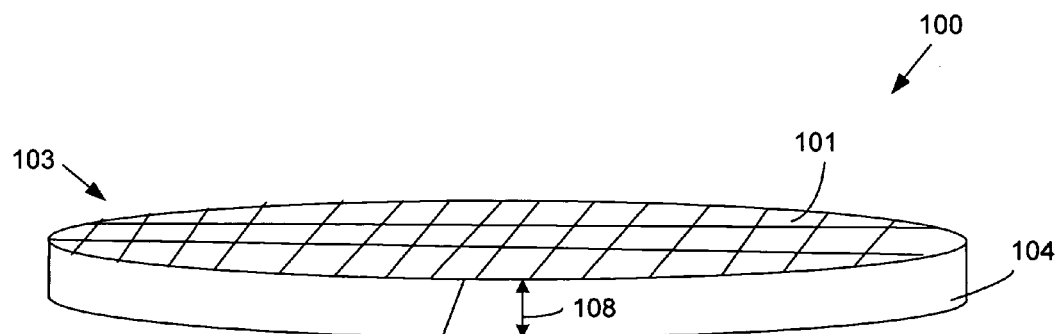
Figure 1C:
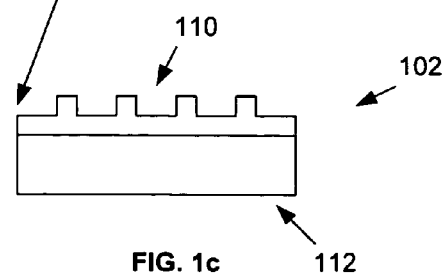

The non-device portion 104 of the device wafer 100 may be thinned utilizing a grinding and/or a polishing technique, as are known in the art (FIG. 1b). The non-device portion 104 of the device wafer 100 may be thinned to a thinned thickness 108. In one embodiment, the thinned thickness 108 may range from about 50 to about 200 microns. The device wafer 100 may then be separated into a plurality of individual die 102 utilizing methods well known to those skilled in the art, such as but not limited to wafer sawing, which serve to separate the plurality of die 101 from each other (FIG. 1c).

Figure 1D:
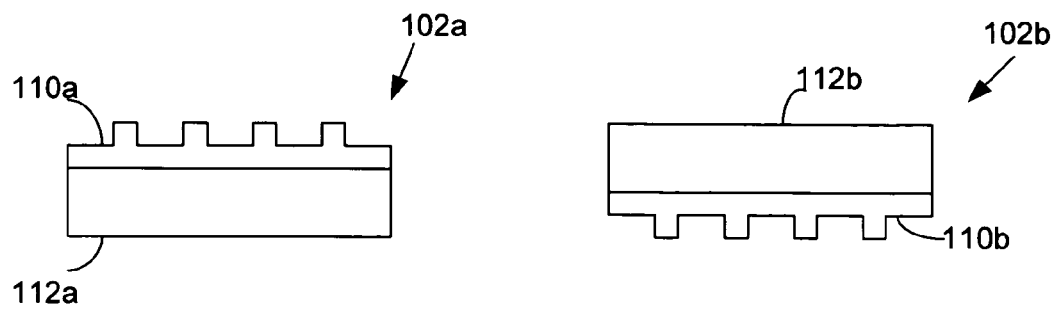
Figure 1E:
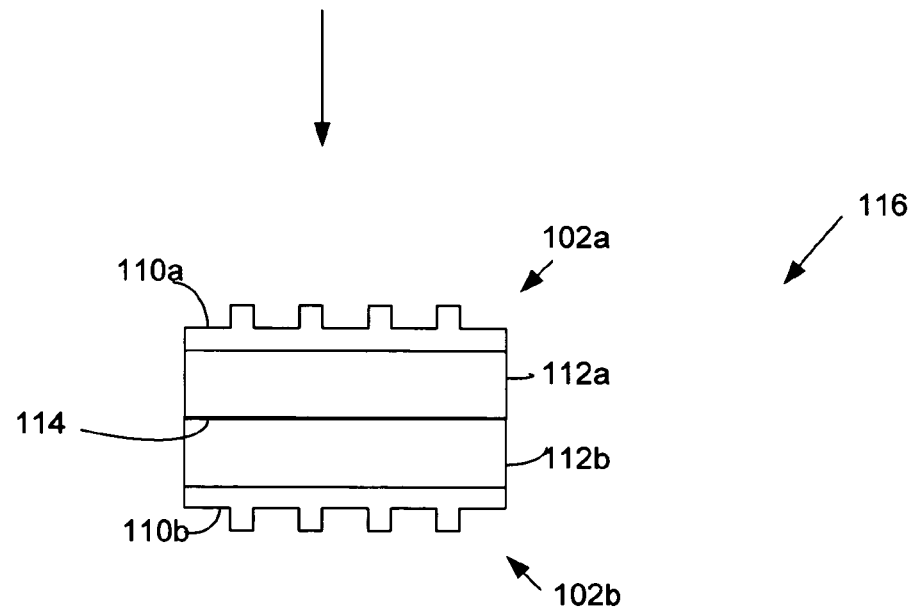

The plurality of individual die 102 may comprise a device side 110 and a non-device side 112. In one embodiment, the non-device side 112 may comprise silicon. The device side 110 may comprise various circuit elements, such as but not limited to transistors, resistors etc. as are well known in the art. In one embodiment, a first individual die 102a may comprise a device side 110a and a non-device side 112a (FIG. 1d). A second individual die 102b may comprise a device side 110b and a non-device side 112b. The non-device side 112a of the first individual die 102a may be brought into contact with the non-device side 112b of the second individual die 102b to form a stacked die structure 116 (FIG. 1e).

Upon contacting the non-device side 112a of the first individual die 102a with the non-device side 112b of the second individual die 102b, a bond 114 may be formed by direct silicon to silicon bonding between the non-device side 112a of the first individual die 102a and the non-device side 112b of the second individual die 102b. The bond 114 may be formed due to Van der Waal forces that may develop between the non-device side 112a (which may comprises silicon) of the first individual die 120a and the non-device side 112b (which also preferably comprises silicon) of the second individual die 102b. In one embodiment, the bond 114 can be further strengthened by heating the stacked die structure 116 to a temperature up to about 450 degrees Celsius, and in another embodiment, by heating from about 250 degrees to about 450 degrees Celsius.

Forming the bond 114 by utilizing direct silicon to silicon bonding according to the methods of the present embodiment alleviates the need for using an interfacial glue, i.e., polymers, adhesives, solders, and other such materials commonly used to join one die to another, as are well known in the art. The elimination of such an interfacial glue, or joining material, to form the bond 114 between the first individual die 102a and the second individual die 102b results in better thermal and electrical contact between the die, due to the low coefficient of thermal expansion (CTE) differences between the die. The CTE differences between the die may be approximately zero when both of the die comprise silicon, for example.

Thus, deleterious thermal barriers may be eliminated between the die joined according to the methods of the present embodiment. In addition, stress between die joined according to the present embodiment are greatly reduced, if not eliminated due to the matching of the CTE's between the joined die. Yet another advantage of joining the die without the use of interfacial glue is that the directly bonded die reinforce each other by increasing rigidity and reducing the strain that would typically be introduced by joining the die with an interfacial glue. Increasing rigidity and reducing strain decreases undesirable shifts in electrical parameters. Yet another advantage of the present embodiment is that the mechanical strength of the bond 114 is improved by utilizing direct silicon to silicon bonding, and in one embodiment the mechanical strength of the bond may comprise at least about 1500 KPa.

Figure 2:
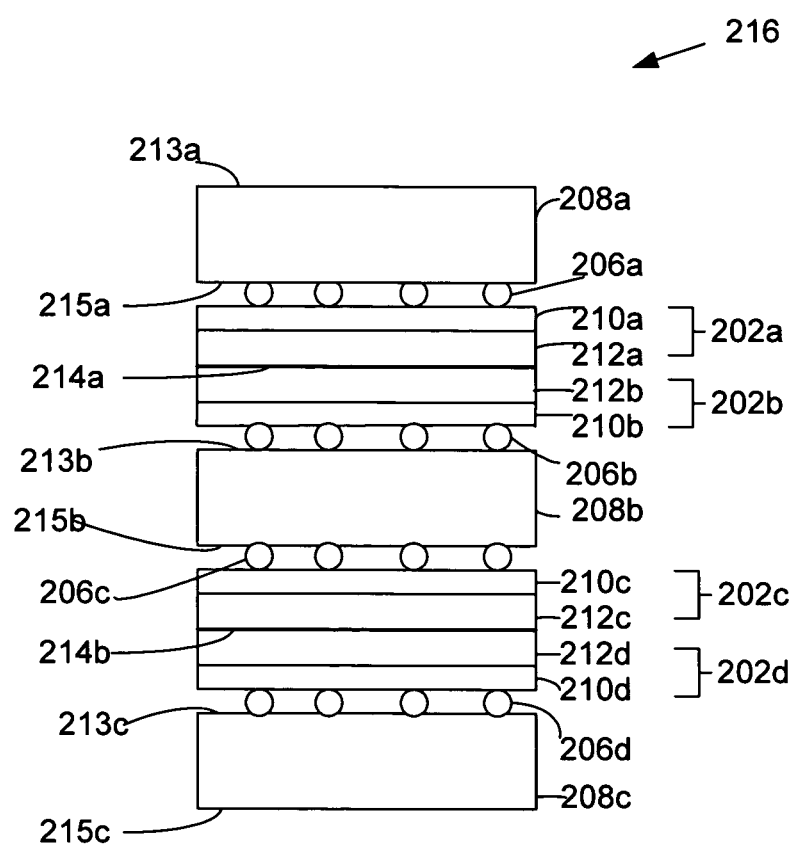
FIG. 2 represents a structure according to an embodiment of the present invention.

FIG. 2 depicts an embodiment of a stacked die structure 216 that may comprise a first individual die 202a, a second individual die 202b, a third individual die 202c, and a fourth individual die 202d. In one embodiment, the individual die 202a, 202b, 202c, 202d may comprise various functionalities, such as but not limited to memory functionalities and/or logic functionalities. The individual die 202a, 202b, 202c, 202d may comprise device sides 210a, 210b, 210c, 210d and non-device sides 212a, 212b, 212c, 212d, respectively. In one embodiment, the non-device sides 212a, 212b, 212c, 212d may preferably comprise silicon.

The non-device side 212a of the first individual die 202a may be bonded to the non-device side 212b of the second individual die 202b (by direct silicon to silicon bonding, as described above) to form a bond 214a, similar to the bond 114 in FIG. 1e. The bond 214a does not comprise an interfacial glue. In like manner, the non-device side 212c of the third individual die 202c may be bonded to the non-device side 212d of the fourth individual die 202d to form a bond 214b, that is similar to the bond 114 of FIG. 1e, and which does not comprise an interfacial glue.

The device side 210a of the first individual die 202a may comprise a first array of contacts 206a, such as but not limited to ball grid array contacts, for example. Similarly, the device side 210b of the second individual die 202b may comprise an second array of contacts 206b. The first array of contacts 206a may be electrically contacted and/or attached to a bottom surface 215a of a first land grid array 208a, as is well known in the art. The first land grid array may also comprise a top surface 213a. The second array of contacts 206b may be electrically connected and/or attached to a top surface 213b of a second land grid array 208b.

The first land grid arrays 208a and the second land grid array 208b may comprise a first organic land grid array and a second organic land grid array, but may comprise any such suitable substrate that may be electrically and/or physically connected to a semiconductor die. It will be understood by those in the art that the land grid arrays 208a, 208b may comprise an array of contacts (not shown) on both their top sides 213a, 213b, and their bottom sides 215a, 215b that correspond and are in electrical and/or physical connection with the array of contacts 206a, 206b. Thus, the non-device sides 212a, 212b of the first and the second individual die 202a,202b may be bonded together by direct silicon to silicon bonding, and the device sides 210a, 210b of the first and second individual die 202a, 202b may be further connected to land grid array substrates 208a, 208b by an array of contacts 206a, 206b.

The third individual die 202c may be electrically connected and/or attached to a bottom surface 215b the second land grid array 208b by a third array of contacts 206c on the device side 210c of the individual die 202c. The fourth individual die 202d may be electrically connected and/or attached to a top surface 213c a third land grid array 208c by a fourth array of contacts 206d on the device side 210d of the fourth individual die 202d. The third land grid array 208c may also comprise a bottom surface 215c. It will be understood by those skilled in the art that the number of levels of die and/or land grid arrays that may be stacked will vary according to a particular design application. Thus, the current embodiment enables the formation of stacked die structures that possess a high strength, low stress bond between the stacked die, without the use of an interfacial glue.

Figure 3:
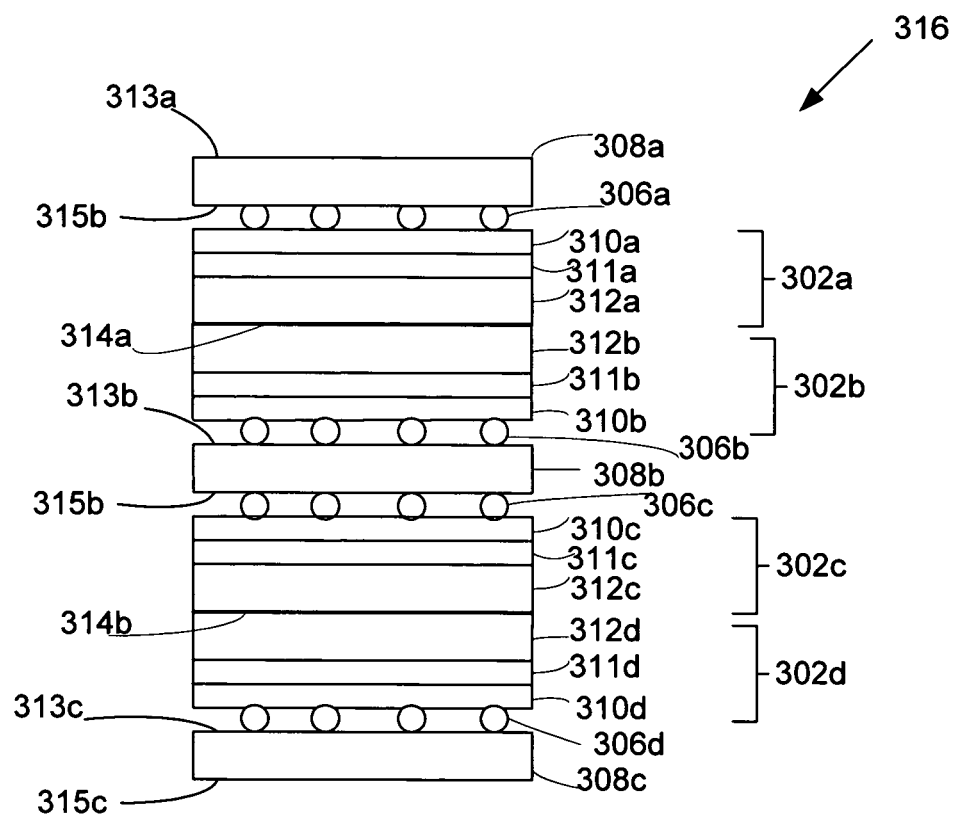
FIG. 3 represents a structure according to another embodiment of the present invention.

FIG. 3 depicts another embodiment of the present invention. FIG. 3 illustrates a cross-section of a stacked die structure 316. The stacked die structure 316 may comprise a first individual die 302a, a second individual die 302b, a third individual die 302c, and a fourth individual die 302d. The individual die 302a, 302b, 302c, 302d may comprise device sides 310a, 310b, 310c, 310d, respectively, that may preferably comprise silicon, and non-device sides 312a, 312b, 312c, 312d, respectively, that may preferably comprise a diamond material, or other equivalent films, as are well known in the art. The diamond material may be formed by any such technique known in the art used to form diamond films, such as, but not limited to, plasma enhanced chemical vapor deposition (PECVD).

A first polysilicon layer 311a, a second polysilicon layer 311b, a third polysilicon layer 311c, and a fourth polysilicon layer 311d, as are well known in the art, may be disposed between the non-device sides 312a, 312b, 312c, 312d and the device sides 310a, 310b, 310c, 310d respectively. The polysilicon layers 311a, 311b, 311c, 311d may serve as an adhesion layer between the non-device layers 312a, 312b, 312c, 312d and the device layers 310a, 310b, 310c, 310b.

The non-device side 312a of the first individual die 302a may be bonded to the non-device side 312b of the second individual die 302b (by direct silicon to silicon bonding, as described above) to form a bond 314a, similar to the bond 114 in FIG. 1e. The bond 314a does not comprise an interfacial glue. In like manner, the non-device side 312c of the third individual die 302c may be bonded to the non-device side 312d of the fourth individual die 302d to form a bond 314b, that is also similar to the bond 114 of FIG. 1e, and which does not comprise an interfacial glue.

The device sides 310a, 310b, 310c, 310d may comprise an array of contacts 306a, 306b, 306c, 306d such as but not limited to ball grid array contacts, for example. The array of contacts 306a may be electrically connected and/or attached to a bottom surface 315b of a first land grid array 308a. The first land grid array 308a may also comprise a top surface 313a. The array of contacts 306b may be electrically connected and/or attached to a top surface 313b of a second land grid array 308b. The array of contacts 306c may be electrically connected and/or attached to a bottom surface 315b of the second land grid array 308b. The array of contacts 306d may be electrically contacted and/or attached to a top surface 313c of a third land grid array 308c. The third land grid array 308c may also comprise a bottom surface 315c. The land grid arrays 308a, 308b and 308c may comprise an organic land grid array, but may comprise any such suitable substrate that may be electrically connected to a semiconductor die.

It will be understood by those skilled in the art that the number of levels of die that may be stacked will vary according to the particular design application. The current embodiment enables the formation of stacked die structures that possess a high strength, low stress bond between the stacked die, without the use of an interfacial glue. In addition, since the current embodiment preferably comprises a silicon on diamond structure, in that the non-device sides 312a, 312b, 312c, 312d preferably comprise diamond and the device sides 310a, 310b, 310c, 310d preferably comprise silicon, the stacked die structure 316 of the current embodiment greatly improves the thermal management capabilities of the stacked die structure 316 by enabling heat spreading to occur by the diamond non-device sides 312a, 312b, 312c, 312d. As detailed above, the present invention describes the formation of stacked die structures that exhibit low stress and high mechanical strength, without the use of interfacial glues between die bonded together.

Figure 4:
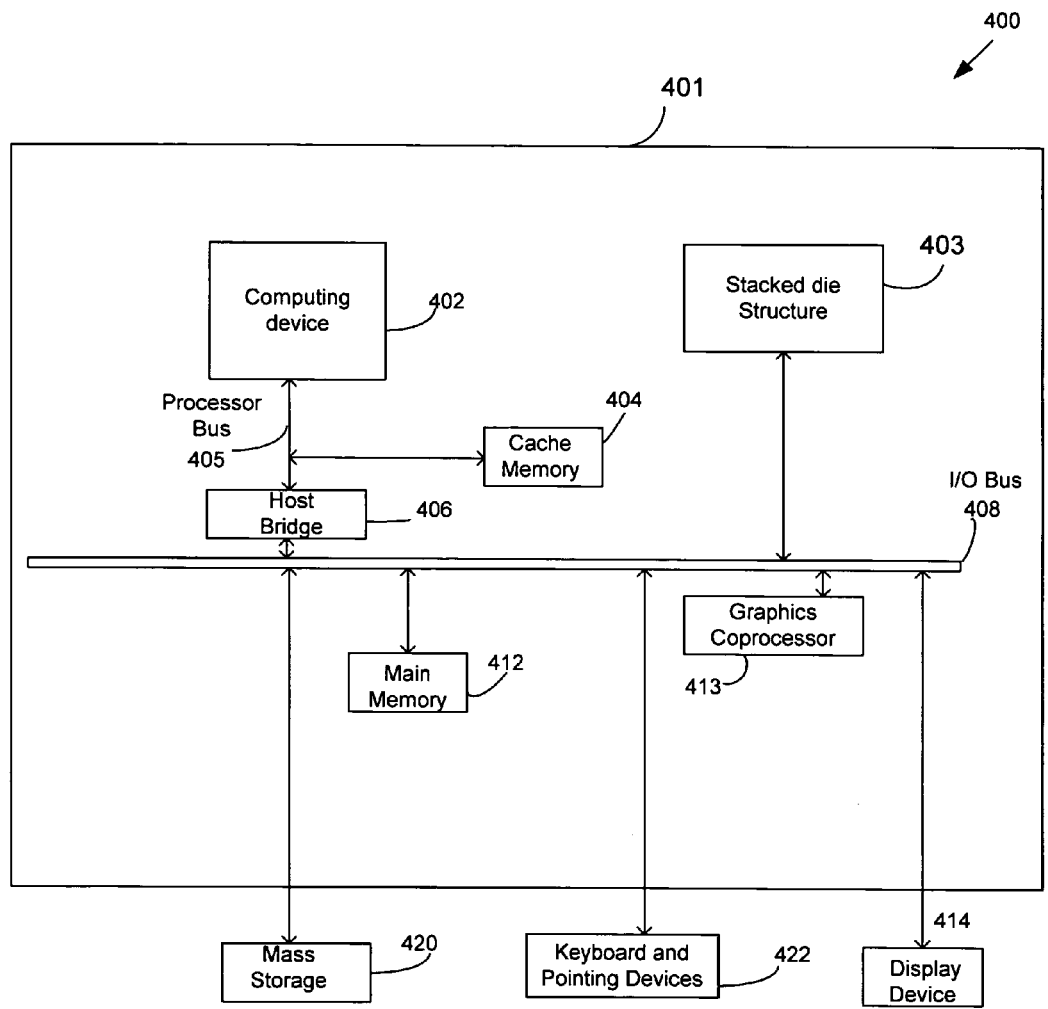
FIG. 4 represents a system according to an embodiment of the present invention.

FIG. 4 is a diagram illustrating an exemplary system capable of being operated with methods for fabricating stacked die structures, such as the stacked die structures 216, 316 of FIGS. 2 and 3 respectively. It will be understood that the present embodiment is but one of many possible systems in which the stacked die structures of the present invention may be used. The system 400 may be used, for example, to execute the processing by various processing tools, such as bonding tools, as are well known in the art, for the methods described herein.

In the system 400, a stacked die structure 403 may be communicatively coupled to a printed circuit board (PCB) 401 by way of an I/O bus 408. The communicative coupling of the stacked die structure 403 may be established by physical means, such as through the use of a package and/or a socket connection to mount the stacked die structure 403 to the PCB 401 (for example by the use of a chip package and/or a land grid array socket). The stacked die structure 403 may also be communicatively coupled to the PCB 401 through various wireless means (for example, without the use of a physical connection to the PCB), as are well known in the art.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the stacked die structure 403 may be a main memory 412. Examples of the main memory 412 may include, but are not limited to, static random access memory (SRAM) and/or dynamic random access memory (DRAM) and/or some other state preserving medium. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming stacked die structures in accordance with embodiments of the present invention, whereas main memory 412 may be used to store on a shorter term basis the executable instructions of a method for forming stacked die structures in accordance with embodiments of the present invention during execution by computing device 402. In addition, the instructions may be stored, or otherwise associated with machine accessible mediums communicatively coupled with the system, such as compact disks, read only memories (CD-ROMs), digital versatile disks (DVDs), floppy disks, and carrier waves, and/or other propagated signals, for example. In one embodiment, main memory 412 may supply the computing device 402 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as stacked die structures, are well known in the art. Therefore, the Figures provided herein illustrate only portions of an exemplary microelectronic device that pertains to the practice of the present invention. Thus the present invention is not limited to the structures described herein.

What is claimed is:

1. A structure comprising:
   a non-device side of a first die directly bonded to a non-device side of a second die, wherein the bond between the non-device side of the first die and the non-device side of the second die is between silicon surfaces of the non-device side of the first die and the non-device side of the second die, wherein the bond between the non-device side of the first die and the non-device side of the second die is by direct silicon to silicon bonding and does not comprise a joining material, and wherein the non-device side of the first die and the non-device side of the second die are substantially in direct contact with each other.

2. The structure of claim 1 wherein the non-device side of the first die and the non-device side of the second die comprise silicon.

3. The structure of claim 1 wherein the non-device side of the first die and the non-device side of the second die comprise a diamond film.

4. The structure of claim 3 wherein a first polysilicon layer is disposed between the non-device side and the device side of the first die, and a second polysilicon layer is disposed between the non-device side and the device side of the second die.

5. A structure comprising:
   a non-device side of a first die directly bonded to a non-device side of a second die, wherein the bond between the non-device side of the first die and the non-device side of the second die is between silicon surfaces of the non-device side of the first die and the non-device side of the second die, wherein the bond between the non-device side of the first die and the non-device side of the second die is by direct silicon to silicon bonding and does not comprise a joining material, and wherein the non-device side of the first die and the non-device side of the second die are substantially in direct contact with each other;

a first array of contacts disposed on a device side of the first die and a second array of contacts disposed on a device side of the second die; and a first land grid array disposed on the first array of contacts and a second land grid array disposed on the second array of contacts.

6. The structure of claim 5 wherein the non-device side of the first die and the non-device side of the second die comprise silicon.

7. The structure of claim 5 wherein the non-device portion of the first die and the non-device side of the second die comprise diamond.

8. The structure of claim 5 wherein a first polysilicon layer is disposed between the device side and the non-device side of the first die and a second polysilicon layer is disposed between the device side and the non-device side of the second die.

9. The structure of claim 5 wherein the first land grid array and the second land grid array comprise a first organic land grid array and a second organic land grid array.

10. The structure of claim 5 wherein the first array of contacts and the second array of contacts comprise a first ball grid array and a second ball grid array.

11. A microelectronic structure, comprising:
a non-device side of a first die; and
a non-device side of a second die directly bonded to the non-device side of the first die;
wherein the bond between the non-device side of the first die and the non-device side of the second die is between silicon surfaces of the non-device side of the first die and the non-device side of the second die, wherein the bond between the non-device side of the first die and the non-device side of the second die is by direct silicon to silicon bonding and does not comprise a joining material, and wherein the non-device side of the first die and the non-device side of the second die are substantially in direct contact with each other, and the non-device side of the first die and the non-device side of the second die comprise a selected one of silicon and a diamond film.

12. The microelectronic structure of claim 11 wherein a first polysilicon layer is disposed between the non-device side and the device side of the first die, and a second polysilicon layer is disposed between the non-device side and the device side of the second die.

13. A system comprising:
a stacked die structure comprising a non-device side of a first die directly bonded to a non-device side of a second die, wherein the bond between the non-device side of the first die and the non-device side of the second die is between silicon surfaces of the non-device side of the first die and the non-device side of the second die, wherein the bond between the non-device side of the first die and the non-device side of the second die is by direct silicon to silicon bonding and does not comprise a joining material, and wherein the non-device side of the first die and the non-device side of the second die are substantially in direct contact with each other;
a PCB communicatively coupled to the stacked die structure; and
a DRAM communicatively coupled to the stacked die structure.

14. The system of claim 13 wherein the stacked die structure further comprises:
a first array of contacts disposed on a device side of the first die and a second array of contacts disposed on a device side of the second die; and
a first land grid array disposed on the first array of contacts and a second land grid array disposed on the second array of contacts.

* * * * *